Dec. 17, 1968
JAMES E. WEBB
ADMINISTRATOR OF THE NATIONAL AERONAUTICS AND SPACE ADMINISTRATION
3,417,266
PULSE MODULATOR PROVIDING FAST RISE AND FALL TIMES
Filed Dec. 23, 1965
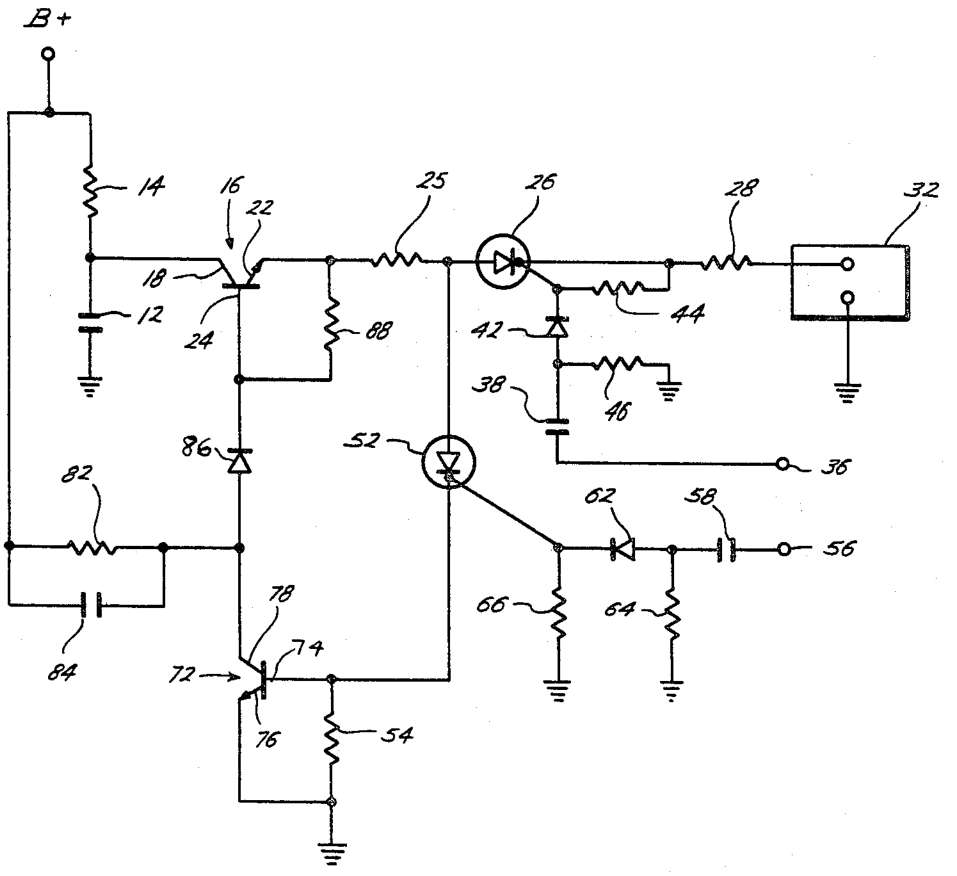
Martin G. Woolfson
INVENTOR.
BY
ATTORNEYS 3,417,266

PULSE MODULATOR PROVIDING FAST RISE AND FALL TIMES

James E. Webb, Administrator of the National Aeronautics and Space Administration with respect to an invention of Martin G. Woolfson, Baltimore, Md.
Filed Dec. 23, 1965, Ser. No. 516,155
4 Claims. (Cl. 307—263)

ABSTRACT OF THE DISCLOSURE

A pulse generator comprising a storage capacitor charged from a source of positive voltage and connected in series with the collector and emitter of an input switching transistor, and a silicon controlled rectifier which provides a current path to a load impedance. A second silicon controlled rectifier is connected between the emitter of the input transistor and ground to provide an alternate current path. A second switching transistor is coupled to the cathode of the second silicon rectifier and the base of the input switching transistor. A voltage "start" pulse source is coupled to the gate of the first silicon rectifier, whereupon a "start" pulse applied to the first SCR gate causes the capacitor to discharge through the input transistor, the first silicon rectifier, and the load. A "stop" pulse voltage source is coupled to the gate of the second silicon rectifier whereupon the application of a "stop pulse" to the second SCR gate causes the current to be diverted from the load to turn "on" the second switching transistor. When the switching transistor turns on, the input transistor is turned off which removes the anode currents from the silicon rectifiers and rendering the silicon rectifiers and the switching transistor nonconductive, thereby reducing power consumption to zero during quiescent conditions.

The invention described herein was made in the performance of work under a NASA contract and is subject to the provision of Section 305 of the National Aeronautics and Space Act of 1958, Public Law 85–568 (72 Stat. 435: 42 U.S.C. 2457).

This invention relates in general to electrical pulse generators and more particularly, to a circuit for producing a high current pulse having a fast rise and fall time.

In electrical pulse generators utilizing power transistors and silicon controlled rectifiers, basic problems are encountered with the use of each of these elements. While the power transistor may exhibit rapid turn-on and low saturation impedance when driven into saturation, its use as a fast switch has been severely limited due to its turn-off time and storage time effects. Further, the silicon control rectifier (SCR), which may be easily turned on, is difficult to turn off. The two techniques of turn-off of the SCR are reducing the anode current to a value below the holding current, or driving the anode voltage below that of the cathode.

In order to overcome the prior art disadvantages of conventional electrical pulse generators which use both power transistors and silicon controlled rectifiers, the present invention provides a pulse generator having high circuit efficiencies while at quiescent conditions, the transistors and the silicon controlled rectifiers of the circuit are cut off, making the stand-by power consumption of the circuit equal to zero. Further, the circuit accomplishes turn-off of the SCR's in the circuit by reduction of the anode current to zero and simultaneously takes advantage of the storage property of the power transistors of the circuit, which normally are deleterious to operation of a fast rise and fall high current pulse circuit.

More particularly, the pulse generator of this invention comprises a storage capacitor which is charged from a source of positive voltage supply. The capacitor is connected to an input transistor at the collector thereof. The emitter of the input transistor is connected through a first SCR to a load. The anode of a second SCR is connected to the anode of the first SCR, the cathode of the second SCR being connected through a resistor to ground and also the base of a switching transistor whose collector is connected to the base of the input transistor. Upon application of a positive pulse to the gate of the first SCR, the biasing of the input transistor causes rapid turn-on of both the first SCR and the input transistor. The storage-capacitor, which has ben charged to the source of positive voltage supply, discharges through the impedance of the collector-emitter circuit of the input transistor and the first SCR to the load. The low impedance of the discharge path permits the generation of a high current, relatively high voltage step across the load. Upon application of a positive stop pulse to the gate of the second SCR, the second SCR turns on, and diverts the output current from the load to a resistor. The voltage across the resistor causes the switching transistor to be turned on, and the input transistor is turned off. Anode current is removed from both SCR's and they also turn off. A short time interval thereafter, the switching transistor turns off. Since both SCR's are turned off when the switching transistor turns off, the input transistor cannot turn on again and the circuit is returned to the quiescent state.

The advantage of this invention, both as to its construction and mode of operation, wil be readily appreciated as the same become better understood by reference to the following detailed description when considered in connection with the accompanying drawing wherein:

The figure is a circuit diagram of a preferred embodiment of the present invention.

Referring now to the drawing, there is shown in the figure the pulse generator wherein a storage capacitor 12 is connected on one side to ground and at its other side to a source of positive DC potential (B+) through a charging resistor 14. The junction of the capacitor 12 and the resistor 14 is connected to an input transistor 16 at its collector terminal 18. The input transistor further comprises an emitter 22 and a base 24. The emitter 22 is connected to one side of a resistor 25, the other side of the resistor 25 being connected to a first SCR 26 at its anode. The cathode of the SCR is connected to one side of the resistor 28, the other side of which is connected to a load 32.

A start pulse terminal 36 is connected to one side of a capacitor 38, the other side of which is connected to the anode of a steering diode 43. The cathode of the steering diode 42 is connected to a gate of the SCR 26. A resistor 44 is connected between the gate and the cathode of the SCR 26. Further, a resistor 46 is connected between ground and the junction of the capacitor 38 and the anode of diode 42.

A second SCR 52 is connected at its anode terminal to the junction of the resistor 25 and the anode of SCR 26. The cathode of the SCR 52 is connected through a resistor 54 to ground. A stop pulse terminal 56 is connected to one side of a capacitor 58, the other side of which is connected to the anode of a steering diode 62. Further, a resistor 64 is connected between ground and the junction of the capacitor 58 and the anode of diode 62. The cathode of diode 62 is connected to the gate of SCR 52 and also through a resistor 66 to ground. The resistors 44 and 66 prevent the anode gate leakage currents from generating a sufficiently high potential between the gate and cathode of SCR's 26 and 52, respectively, to prevent premature turn-on of the SCR's.

A switching transistor 72, having a base 74, an emitter 76, and a collector 78, is connected at its base 74 to the cathode of SCR 52 and at its emitter 76 to ground. The collector 78 is connected to the positive DC power supply (B+) through a parallel R-C network comprising a resistor 82 and a capacitor 84. The collector 78 is also connected to the anode of a steering diode 86, the cathode of which is connected to the base 24 of input transistor 16. Further, a resistor 88 is connected across the base-emitter circuit of transistor 16 to prevent premature turn-on of the transistor which could be caused by the collector to base leakage current generating a sufficiently high potential between the base and emitter of transistor 16.

With the foregoing in mind, operation of the circuit of the figure is as follows:

At quiescent conditions, the input transistor 16, the switching transistor 72, the first SCR 26, and the second SCR 52 are cut off, making the power consumption of the circuit equal to zero. When a positive pulse is applied to the start pulse terminal 36 which in turn is fed to the gate of SCR 26, the SCR 26 and the transistor 16 are both rapidly turned on. The capacitor 12, which was initially charged to the power supply voltage B+, discharges through a path comprising the saturation impedances of the transistor 16 and the SCR 26, the resistor 25 and the resistor 28 to the load 32. The low impedances of the discharge path permits the generation of a high current, relatively high voltage step across the load.

When a positive pulse is applied to the stop pulse terminal 56, which in turn is fed to the gate of the second SCR 52, the SCR 52 is turned on and diverts the output current from the load 32 through the SCR 52 to the resistor 54. The value of the resistor 54 is made small such that the voltage drop across the SCR 52 and the resistor 54 is low, and the initial current flowing from the base-emitter junction of transistor 72 is sufficient to saturate the transistor.

When the transistor 72 turns on, the transistor 16 is turned off. Due to storage effects, the transistor 16, the SCR 26, and the SCR 52 do not turn off immediately. However, with transistor 16 turned off and the transistor 72 is turned on, anode current is removed from the SCR 26 and the SCR 52, and they turn off. A short time interval after the turn off of SCR 52, transistor 72 turns off. Since SCR 26 and SCR 52 are turned off when transistor 72 ultimately turns off, transistor 16 cannot turn on again, and the circuit is returned to the quiescent state until a positive start pulse applied to the terminal 36 starts the cycle again.

The resistor 82 serves to limit the base current to transistor 16 during the turn-on cycle and limits collector current in transistor 72 during the turn-off of transistor 16. The capacitor 84 is of a small value and acts as a speed-up capacitor to enhance the turn-on of transistor 16.

The resistor 46 and the resistor 64 prevent the capacitors 38 and 58, respectively, from retaining a charge between successive applications of start and stop pulses. However, if the start and stop pulse sources have direct return paths to the circuit ground, the resistors 46 and 64, of course, are not required. Thus, if the pulse sources have return paths to ground, the start pulse terminal 36 could be connected directly to the anode of diode 42 and the stop pulse terminal 56 could be connected directly to the anode of diode 62.

In a typical application, the pulse on time (start pulse time to stop pulse time) and the circuit storage time represent a small fraction of the interpulse period (start pulse time to start pulse time). The storage capacitor 12, under these conditions, suffers negligible discharge permitting an average current to peak current ratio, which approaches the duty cycle ratio. In this manner, high pulse currents can be generated with high circuit efficiency. It is important to note that the pulse on time is determined by the turn-on characteristics of the circuit elements employed, thus resulting in both fast rise and fall times for the output pulse. Thus, the circuit described produces an effective and compatible arrangement of transistors and SCR's, and employs them to enhance the desirable characteristics of both.

It should be further understood that the foregoing disclosure relates only to preferred embodiments of the invention, and that it is intended to cover all changes and modifications of the examples of the invention herein chosen for the purpose of the disclosure which do not constitute departures from the spirit and scope of the invention.

What is claimed and desired to be secured by Letters Patent is:

1. An electrical pulse generator in accordance with claim 2 wherein said second switching means comprises a second transistor having a base, an emitter, and a collector, said second transistor having a conductive state and a nonconductive state:

means for changing said second switching means to the conductive state when the said second silicon controlled rectifier changes to the conductive state comprising a resistor coupled across said base-emitter circuit of said second transistor; and means coupling said second silicon controlled rectifier cathode to said base of said second transistor; and means coupling said second transistor collector to said first switching means transistor base for changing said first switching means transistor to the nonconductive state when said second transistor changes to the conductive state.

2. An electrical pulse generator for generating a pulse having a fast rise and fall time through a load comprising:

a charging capacitor;

means for charging said capacitor;

a first switching means having a conductive state and a nonconductive state coupled to said charging capacitor, said first switching means comprising a transistor having a base, an emitter, and a collector and wherein said collector is coupled to said charging capacitor;

a first current path means coupled to the transistor emitter of said first switching means for discharging said capacitor through said load, said first current path means comprising a silicon controlled rectifier having an anode coupled to said transistor emitter, a gate, and a cathode coupled to said load, said silicon controlled rectifier having a conductive state and a nonconductive state;

a second current path means coupled to the transistor emitter of said first switching means for diverting the current fro said first current path to said second current path;

a second switching means coupled to said second current path means and said transistor base for changing said first switching means from the conductive state to the nonconductive state; and means coupled to said silicon controlled rectifier gate for changing said transistor and said silicon controlled rectifier to conductive state and thereby discharging said capacitor through said load.

3. An electrical pulse generator in accordance with claim 2 wherein said second path means comprises a second silicon controlled rectifier having an anode, a cathode, and a gate, said second silicon controlled rectifier having a conductive state and a nonconductive state, and wherein said transistor emitter is coupled to said second silicon controlled rectifier anode, said second silicon controlled rectifier cathode is coupled to second switching means; and means coupled to said second silicon controlled rectifier gate for changing said second silicon controlled rectifier to said conductive state to thereby divert the current from said first current path to said second current path.

4. An electrical pulse generator for generating a pulse having a fast rise and fall time through a load comprising:

a charging capacitor;

means for charging said capacitor;

a first switching means having a conductive state and a nonconductive state coupled to said charging capacitor, said first switching means comprising a transistor having a base, an emitter, and a collector and wherein said collector is coupled to said charging capacitor;

a first current path means coupled to the transistor emitter of said first switching means for discharging said capacitor through said load, said first current path means comprising a first silicon controlled rectifier having an anode, a cathode, and a gate, said first silicon recitifier being connected anode-to-cathode in series between said load and said means for charging said capacitor;

a second current path means coupled to the transistor emitter of said first switching means for diverting the current from said first current path to said second current path, said second current path means comprising a second silicon controlled rectifier having an anode, a cathode, and a gate;

a second switching means coupled to said second current path means and said transistor base for changing said first switching means from the conductive state to the nonconductive state, said second silicon controlled rectifier being connected anode-to-cathode in series between the transistor emitter of said first switching means and said transistor base; and means for causing said capacitor to discharge through said load comprising a positive pulse source coupled to the gate of said first silicon controlled rectifier and means for diverting said current through said second current path means comprising a positive pulse source coupled to said second silicon controlled rectifier gate.

References Cited

UNITED STATES PATENTS

| | | | |
|---|---|---|---|
| 3,100,872 | 8/1963 | Hickey et al. | 328—67 |
| 3,214,696 | 10/1965 | Hickey | 328—67 |
| 3,252,100 | 5/1966 | Webb | 328—67 |
| 3,303,356 | 2/1967 | Bell | 307—88.5 |
| 3,282,632 | 11/1966 | Arsem | 307—273 |

ARTHUR GAUSS, *Primary Examiner.*

S. D. MILLER, *Assistant Examiner.*

U.S. Cl. X.R.

307—246, 265, 268, 252; 328—67